United States Patent
So et al.

(10) Patent No.: US 10,474,265 B2
(45) Date of Patent: Nov. 12, 2019

(54) TOUCH SENSOR INTEGRATED TYPE DISPLAY DEVICE AND METHOD OF OPERATING THE SAME

(71) Applicant: LG Display Co., Ltd., Seoul (KR)

(72) Inventors: Byeongseong So, Goyang-si (KR); Kitae Kwon, Paju-si (KR); Kyujin Kim, Goyang-si (KR); Seungwan Cho, Yangju-si (KR)

(73) Assignee: LG Display Co., Ltd., Seoul (KR)

( * ) Notice: Subject to any disclaimer, the term of this patent is extended or adjusted under 35 U.S.C. 154(b) by 7 days.

(21) Appl. No.: 15/712,423

(22) Filed: Sep. 22, 2017

(65) Prior Publication Data

US 2018/0095572 A1 Apr. 5, 2018

(30) Foreign Application Priority Data

Sep. 30, 2016 (KR) .................. 10-2016-0127120

(51) Int. Cl.
*G06F 3/041* (2006.01)
*G02F 1/1333* (2006.01)
(Continued)

(52) U.S. Cl.
CPC .......... *G06F 3/0412* (2013.01); *G02F 1/1343* (2013.01); *G02F 1/13338* (2013.01);
(Continued)

(58) Field of Classification Search
USPC .................................................. 345/173–174
See application file for complete search history.

(56) References Cited

U.S. PATENT DOCUMENTS

2003/0231735 A1* 12/2003 Moon .................. G09G 3/3685
377/64
2008/0012818 A1* 1/2008 Lee ...................... G09G 3/3677
345/100
(Continued)

FOREIGN PATENT DOCUMENTS

CN 101762918 A1 6/2010
CN 104900211 A1 9/2015
(Continued)

OTHER PUBLICATIONS

Japanese Office Action dated Sep. 18, 2018, issued in corresponding Japanese Patent Application No. 2017-189926.
(Continued)

*Primary Examiner* — Kwin Xie
(74) *Attorney, Agent, or Firm* — Morgan, Lewis & Bockius LLP

(57) ABSTRACT

A touch sensor integrated type display device includes: a display panel including first and second panel blocks (PBs), each including a pixel array with embedded touch sensors, a display driving circuit providing image data to pixels of the first and second PBs during a display period, and a touch sensing circuit driving the touch sensors of the first and second PBs during a touch sensing period, the display driving circuit including a shift register sequentially providing gate pulses (GPs) to gate lines, the shift register including: a first stage group (SG) applying a GP to gate lines in the first PB, a bridge stage connected in cascade to a last stage of the first SG, and providing a first carry signal, and a second SG applying a GP to gate lines in the second PB, a first stage of the second SG operating in response to the first carry signal.

12 Claims, 14 Drawing Sheets

(51) Int. Cl.
 *G02F 1/1343* (2006.01)
 *G09G 3/36* (2006.01)
 *G11C 19/28* (2006.01)

(52) U.S. Cl.
 CPC ......... *G06F 3/0416* (2013.01); *G09G 3/3677* (2013.01); *G11C 19/28* (2013.01); *G09G 2310/08* (2013.01)

(56) References Cited

U.S. PATENT DOCUMENTS

| | | | |
|---|---|---|---|
| 2010/0156862 A1 | 6/2010 | Kim et al. | |
| 2010/0194707 A1* | 8/2010 | Hotelling | G06F 3/0412 345/173 |
| 2013/0038587 A1* | 2/2013 | Song | G09G 5/18 345/211 |
| 2013/0169609 A1 | 7/2013 | Son et al. | |
| 2013/0241814 A1 | 9/2013 | Hirabayashi et al. | |
| 2015/0253924 A1* | 9/2015 | Park | G06F 3/0412 345/174 |
| 2015/0355767 A1* | 12/2015 | Abe | G06F 3/0412 345/174 |
| 2016/0224175 A1 | 8/2016 | Moon | |
| 2017/0052635 A1 | 2/2017 | Yu et al. | |
| 2017/0178584 A1 | 6/2017 | Ma et al. | |

FOREIGN PATENT DOCUMENTS

| | | |
|---|---|---|
| CN | 105845065 A1 | 8/2016 |
| EP | 3 051 531 A1 | 8/2016 |
| JP | 2013-190719 A | 9/2013 |
| WO | 2015/137706 A1 | 9/2015 |

OTHER PUBLICATIONS

Taiwanese Office Action dated Jun. 11, 2018, issued in corresponding Taiwanese Patent Application No. 106133815.
Extended European Search Report dated Nov. 13, 2017, for corresponding European Application No. 17 19 2280.0.

* cited by examiner

US 10,474,265 B2

TOUCH SENSOR INTEGRATED TYPE DISPLAY DEVICE AND METHOD OF OPERATING THE SAME

CROSS-REFERENCE TO RELATED APPLICATIONS

This application claims the priority of Korean Application No. 10-2016-0127120, filed on Sep. 30, 2016, the entirety of which is hereby incorporated by reference.

BACKGROUND

1. Technical Field

The present disclosure relates to a touch sensor integrated type display device and a method of operating the same.

2. Discussion of the Related Art

Flat panel displays (hereinafter referred to as "display devices"), which are able to be manufactured as a large-sized display device at a low price and excellent in display quality (including motion picture representation, resolution, brightness, contrast ratio, color representation, etc.), have been actively developed in accordance with a need for display devices capable of properly displaying multimedia together with the development of multimedia. Various input devices, such as a keyboard, a mouse, a track ball, a joystick, and a digitizer, have been used in the display devices to allow users to interface with the display devices. However, when the user makes use of these input devices, the user's dissatisfaction may increase because the user may be required to learn how to use the input devices, and the input devices occupy space, thereby decreasing desirability of products. Thus, a demand for a convenient and simple input device for the display device capable of reducing erroneous operation has increased. In response to the increased demand, a touch sensor has been proposed to recognize information when the user inputs information by directly touching the screen or approaching the screen with his or her hand or a pen while he or she watches the display device.

FIGS. 1 and 2 illustrate a display drive and a touch sensing drive on a per block basis in accordance with a related art.

The touch sensors used in the display device may be implemented through an in-cell technology in which they are embedded inside a display panel. A display device using in-cell technology may share a touch electrode of a touch sensor and a common electrode of a display panel with each other, and may time-divide one frame into a display period and a touch sensing period. For example, as shown in FIG. 1, a display panel may be divided into a plurality of panel blocks PB1 and PB2, and a display drive and a touch sensing drive may be performed on each of the panel blocks PB1 and PB2. For example, data of an input image may be written to pixels of the first panel block PB1 during a first display period Td1, and then touch sensors may be driven to sense a touch input during a first touch sensing period Tt1. Subsequently, data of the input image may be written to pixels of the second panel block PB2 during a second display period Td2, and then the touch sensors may be driven to sense a touch input during a second touch sensing period Tt2.

During a display period, a gate driver may sequentially shift a gate pulse applied to gate lines using a shift register. The gate pulse may sequentially select pixels to be charged with a data signal in synchronization with the data signal of the input image on a per line basis. The shift register of the gate driver may include cascade-connected stages. The cascade-connected stages of the shift register each receive a start pulse or an output of a preceding stage and charge a Q node. When the display period is not divided, all the stages of the shift register may have the same Q node charging period (hereinafter, referred to as a "Q standby period") of about two horizontal periods.

However, as shown in FIG. 2, when the display period is divided based on the number of blocks and the touch sensing period is allocated between the divided display periods, a Q node of a stage, which generates a first output immediately after the touch sensing period, is discharged by a length of the touch sensing period, and generates a low output. In the case of a full high definition (FHD) display device, one horizontal period is about 6.0 μs, and a touch sensing period is about 100 μs. Thus, a Q standby period of a stage, which generates a first output immediately after the touch sensing period, is about 100 μs or more, and a Q standby period of other stages of the shift register is about 12.0 μs. Because a discharge time of the Q node increases as the Q standby period of the Q node becomes longer, a line dim phenomenon appears on a first line, at which the display period again starts immediately after the touch sensing period.

SUMMARY

Accordingly, the present disclosure is directed to a touch sensor integrated type display device and a method of operating the same that substantially obviate one or more of the issues due to limitations and disadvantages of the related art.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts as embodied and broadly described, there is provided a touch sensor integrated type display device, including: a display panel including first and second panel blocks, each of the first and second panel blocks including a pixel array in which touch sensors are embedded, a display driving circuit configured to provide image data to pixels of each of the first and second panel blocks during a display period, and a touch sensing circuit configured to drive the touch sensors of each of the first and second panel blocks during a touch sensing period, wherein the display driving circuit includes a shift register configured to sequentially provide gate pulses to gate lines, wherein the shift register includes: a first stage group configured to apply a gate pulse to gate lines in the first panel block, a bridge stage connected in cascade to a last stage of the first stage group, the bridge stage being configured to provide a first carry signal, and a second stage group configured to apply a gate pulse to gate lines in the second panel block, and wherein a first stage of the second stage group is configured to operate in response to the first carry signal.

In another aspect, there is provided a method of operating a touch sensor integrated type display device including a display panel including first and second panel blocks, each of the first and second panel blocks including a pixel array in which touch sensors are embedded, the method comprising: during a touch sensing period, by a touch sensing circuit, driving the touch sensors of each of the first and second panel blocks, during a display period: by a display driving circuit, providing image data to pixels of each of the first and second panel blocks; and by a shift register included in the display driving circuit: sequentially providing gate pulses to gate lines, by a first stage group included in the shift register, applying a gate pulse to gate lines in the first panel block; by a bridge stage, providing a first carry signal, the bridge stage being included in the shift register, the bridge stage being connected in cascade to a last stage of the first stage group; and by a second stage group included in the shift register, applying a gate pulse to gate lines in the second panel block, wherein a first stage of the second stage group operates in response to the first carry signal.

Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the following claims. Nothing in this section should be taken as a limitation on those claims. Further aspects and advantages are discussed below in conjunction with the embodiments of the disclosure. It is to be understood that both the foregoing general description and the following detailed description of the present disclosure are examples and explanatory, and are intended to provide further explanation of the disclosure as claimed.

BRIEF DESCRIPTION OF THE DRAWINGS

The accompanying drawings, which are included to provide a further understanding of the disclosure and are incorporated in and constitute a part of this specification, illustrate embodiments of the disclosure and together with the description serve to explain various principles of the disclosure.

Figure 1:
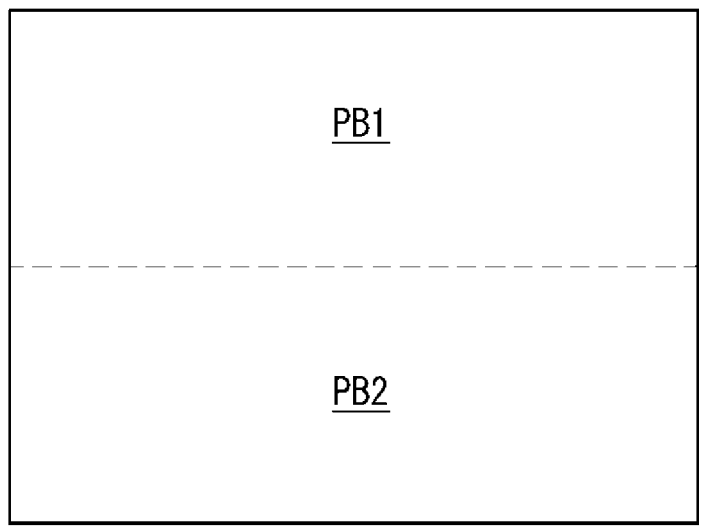
FIGS. 1 and 2 illustrate a display drive and a touch sensing drive on a per block basis in accordance with a related art.
Figure 2:
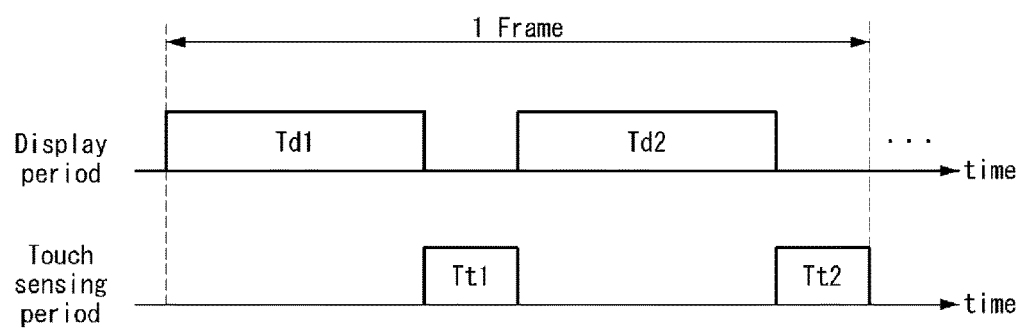

Throughout the drawings and the detailed description, unless otherwise described, the same drawing reference numerals should be understood to refer to the same elements, features, and structures. The relative size and depiction of these elements may be exaggerated for clarity, illustration, and convenience.

DETAILED DESCRIPTION

Reference will now be made in detail to some embodiments of the present disclosure, examples of which are illustrated in the accompanying drawings. In the following description, when a detailed description of well-known functions or configurations related to this document is determined to unnecessarily cloud a gist of the inventive concept, the detailed description thereof will be omitted. The progression of processing steps and/or operations described is an example; however, the sequence of steps and/or operations is not limited to that set forth herein and may be changed as is known in the art, with the exception of steps and/or operations necessarily occurring in a particular order. Like reference numerals designate like elements throughout. Names of the respective elements used in the following explanations are selected only for convenience of writing the specification and may be thus different from those used in actual products.

In the description of embodiments, when a structure is described as being positioned "on or above" or "under or below" another structure, this description should be construed as including a case in which the structures contact each other as well as a case in which a third structure is disposed therebetween.

Switching elements of a gate driver according to embodiments may be implemented as transistors of n-type or p-type metal oxide semiconductor field effect transistor (MOSFET) structure. In embodiments disclosed herein, n-type transistors are described by way of example. However, embodiments are not limited thereto, and other types of transistors may be used. The transistor is a three-electrode element including a gate, a source, and a drain. The source is an electrode for supplying carriers to the transistor. The carriers inside the transistor may begin to flow from the source. The drain is an electrode from which the carriers exit the transistor. For example, carriers in the MOSFET flow from the source to the drain. In case of an n-type MOSFET (NMOS), because carriers are electrons, a source voltage is less than a drain voltage so that electrons can flow from a source to a drain. In the n-type MOSFET, because electrons flow from the source to the drain, a current flows from the drain to the source. In case of a p-type MOSFET (PMOS), because carriers are holes, a source voltage is greater than a drain voltage so that holes can flow from a source to a drain. In the p-type MOSFET, because holes flow from the source to the drain, a current flows from the source to the drain. In embodiments disclosed herein, the source and the drain of the MOSFET are not fixed. For example, the source and the drain of the MOSFET may be changed, depending on an applied voltage. The following embodiments relate to the source and the drain of the transistor.

Figure 3:
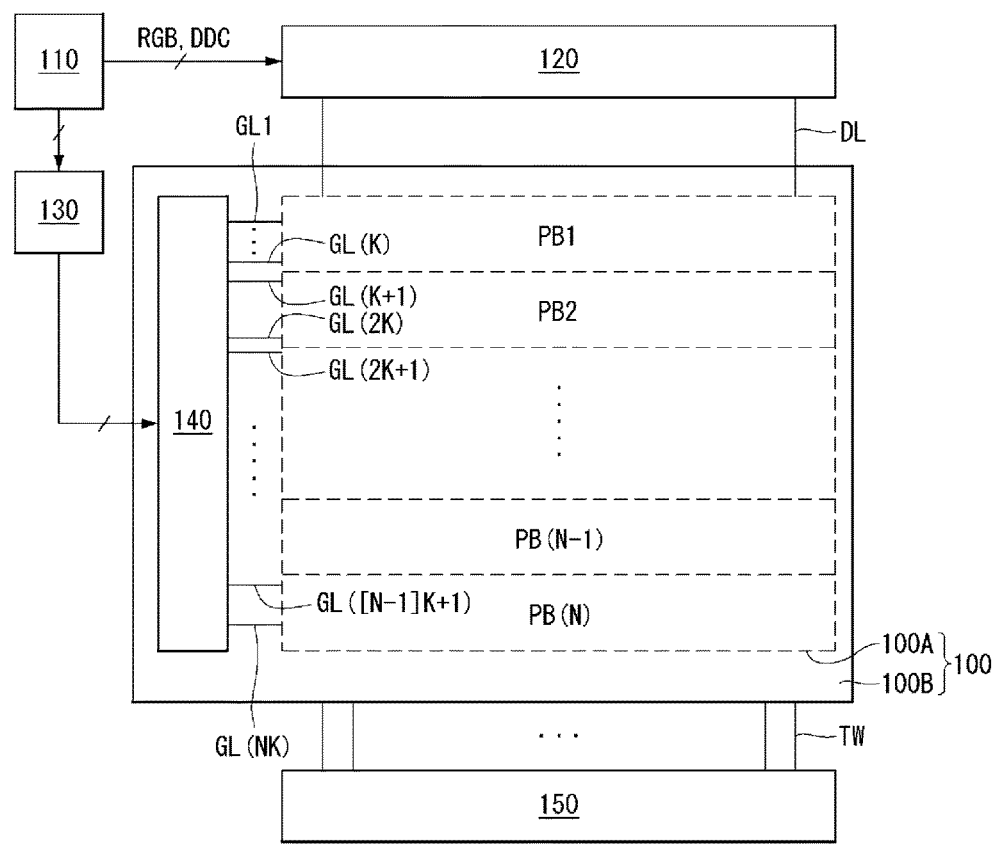
FIG. 3 illustrates a display device according to an example embodiment.
Figure 4:
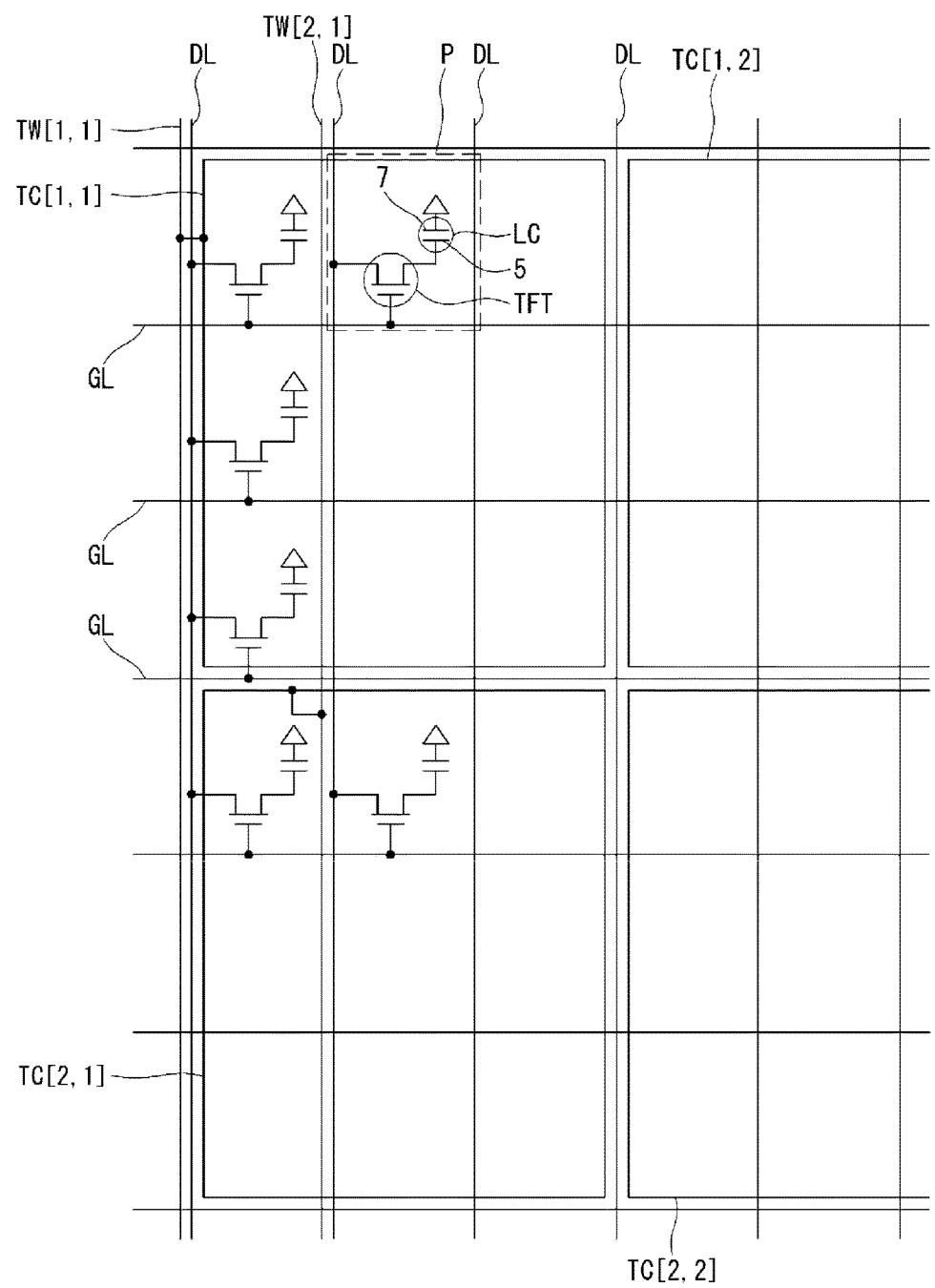
FIG. 4 is a plan view of a pixel array according to an example embodiment.
Figure 5:
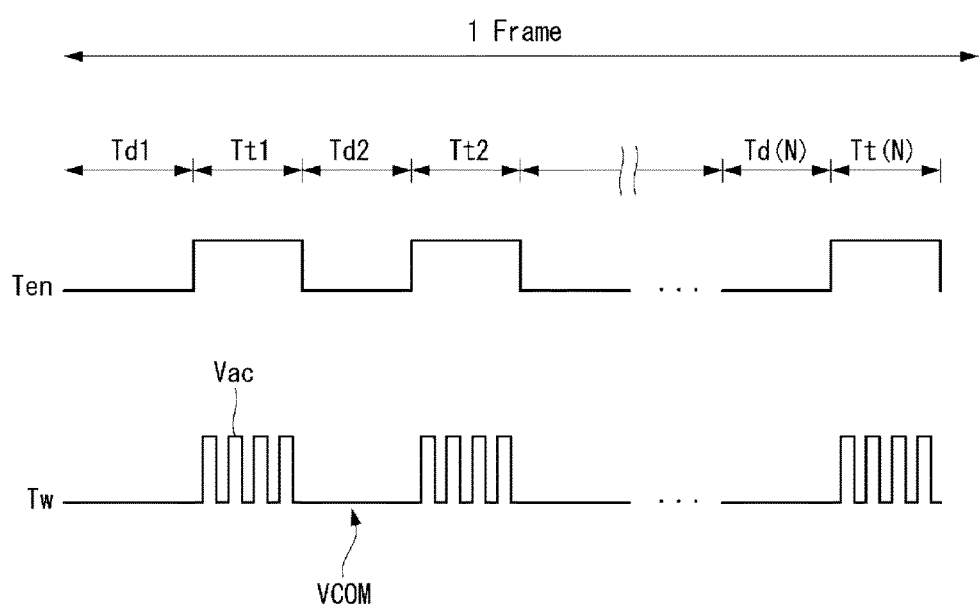
FIG. 5 illustrates a timing of a touch sync signal and a timing of a common voltage.

FIG. 3 illustrates a display device according to an example embodiment. FIG. 4 is a plan view of a pixel array according to an example embodiment. FIG. 5 illustrates a timing of a touch sync signal and a timing of a common voltage.

FIG. 3 illustrates a touch sensor integrated type display device according to an example embodiment. FIG. 4 illustrates pixels included in a touch sensor according to an example embodiment. FIG. 5 illustrates signals output to signal lines by a driving circuit. In the FIGS. 3 and 4 examples, the respective touch sensors and the respective sensing lines are designated with a separate reference numeral. However, in the following description, the touch sensors and the sensing lines will be commonly referred to as a "touch sensor TC" and a "sensing line TW" when they are described without distinguishing their positions.

With reference to FIGS. 3 to 5, a touch sensor integrated type display device according to an example embodiment may include a display panel 100, a timing controller 110, a data driver 120, first and second gate drivers 130 and 140 (which may include a level shifter 130 and a stage group SG), and a touch sensing circuit 150. The display panel 100 may include a display unit (or area) 100A and a non-display unit (or area) 100B. The display unit 100A may include pixels P for displaying image information and touch sensors TC. The non-display unit 100B may be disposed outside the display unit 100A.

The display unit 100A may be divided into N panel blocks PB1 to PB(N). Each of the panel blocks PB1 to PB(N) may display an image, and may perform a touch sensing driving operation. Further, each of the panel blocks PB1 to PB(N) may include K pixel lines, where "K" is a natural number. Each pixel line may be connected to first to $K^{th}$ gate lines GL1 to GL(K).

A pixel array of the display panel 100 may include data lines DL, gate lines GL, thin film transistors TFT formed at crossings of the data lines DL and the gate lines GL, pixel electrodes 5 connected to the thin film transistors TFT, storage capacitors (Cst) connected to the pixel electrodes 5, and the like. The thin film transistor TFT may be turned on in response to a gate pulse from the gate line GL, and may supply a data voltage, applied through the data line DL, to the pixel electrode 5. A liquid crystal layer LC may be driven by a voltage difference between the data voltage charged to the pixel electrode 5 and a common voltage VCOM applied to a common electrode 7 and controls an amount of light transmitted.

The touch sensors TC may be connected to the plurality of pixels P, and may be implemented as capacitive touch sensors to sense a touch input. Each touch sensor TC may include the plurality of pixels P. FIG. 4 illustrates an example in which nine pixels P arranged in a 3×3 matrix are assigned to one touch sensor TC. However, embodiments are not limited thereto. In the illustrated example, because the common electrode 7 may be divided based on each touch sensor TC, an area occupied by the common electrode 7 may be referred to as the "touch sensor TC." The touch sensors TC may be respectively connected to sensing lines TW. For example, a sensing line TW[1, 1] of a first row and a first column may be connected to a touch sensor TC[1, 1] of the first row and the first column; and a sensing line TW[1, 2] of the first row and a second column may be connected to a touch sensor TC[1, 2] of the first row and the second column. The common electrode 7 may receive a reference voltage (e.g., the common voltage VCOM) of the pixels P during a display period, and may receive a touch sensing signal Vac during a touch sensing period.

The non-display unit 100B may be disposed outside the display unit 100A, and a driving circuit IC for driving the data lines DL. The gate lines GL may be disposed in the non-display unit 100B.

A display driving circuit may include the data driver 120 and the first and second gate drivers 130 and 140, and may provide data of an input image to the pixels P of the display panel 100. The display driving circuit may time-divide one frame period into a plurality of display periods and a plurality of touch sensing periods, and may provide the data of the input image to the pixels P on a per block basis in the display period. As shown in the FIG. 5 example, one frame may include N display periods Td1 to Td(N) and N touch sensing periods Tt1 to Tt(N). The display periods Td1 to Td(N) and the touch sensing periods Tt1 to Tt(N) may alternate with each other. During the first display period Td1, image data may be provided to a first panel block PB1. During the first touch sensing period Tt1, the touch sensors TC inside the first panel block PB1 may be driven.

The data driver 120 may receive image data from the timing controller 110, and may convert the image data into positive and negative gamma compensation voltages to output (provide) positive and negative data voltages. The data driver 120 may then supply the positive and negative data voltages to the data lines DL.

The first and second gate drivers 130 and 140 may sequentially supply the gate pulses to the gate lines GL under the control of the timing controller 110. The gate pulse output (provided) from the gate driver may be synchronized with the data voltage. The first and second gate drivers 130 and 140 may include the level shifter 130 and the stage group SG, which may be connected between the timing controller 110 and the gate lines of the display panel 100. The level shifter 130 may level-shift transistor-transistor-logic (TTL) level voltages of gate clocks CLK input from the timing controller 110 to a gate high voltage VGH and a gate low voltage VGL. The stage group SG may include stages that shift a start signal VST in accordance with the gate clock CLK, and may sequentially output (provide) gate pulses Gout.

The timing controller 110 may transmit data of an input image received from a host system (not shown) to the data driver 120. The timing controller 110 may receive timing signals, such as a vertical sync signal Vsync, a horizontal sync signal Hsync, a data enable signal DE, and a main clock MCLK, from the host system in synchronization with the data of the input image. The timing controller 110 may generate a data timing control signal for controlling operation timing of the data driver 120 and a gate timing control signal for controlling operation timing of the first and second gate drivers 130 and 140 based on the timing signals. The timing controller 110 may synchronize the display driving circuit with the touch sensing circuit 150.

The touch sensing circuit 150 may drive the touch sensors TC in response to a touch enable signal Ten received from the timing controller 110 or the host system during the touch sensing period. The touch sensing circuit 150 may supply the touch driving signal Vac to the touch sensors TC through the sensor lines TW to sense a touch input during the touch sensing period. The touch sensing circuit 150 may analyze a change amount of charges of the touch sensor, which may vary depending on the presence or absence of a touch input, and may determine the touch input. The touch sensing circuit 150 may calculate coordinates of a position of the touch input, and may transmit coordinate information of the touch input position to the host system.

Figure 6:
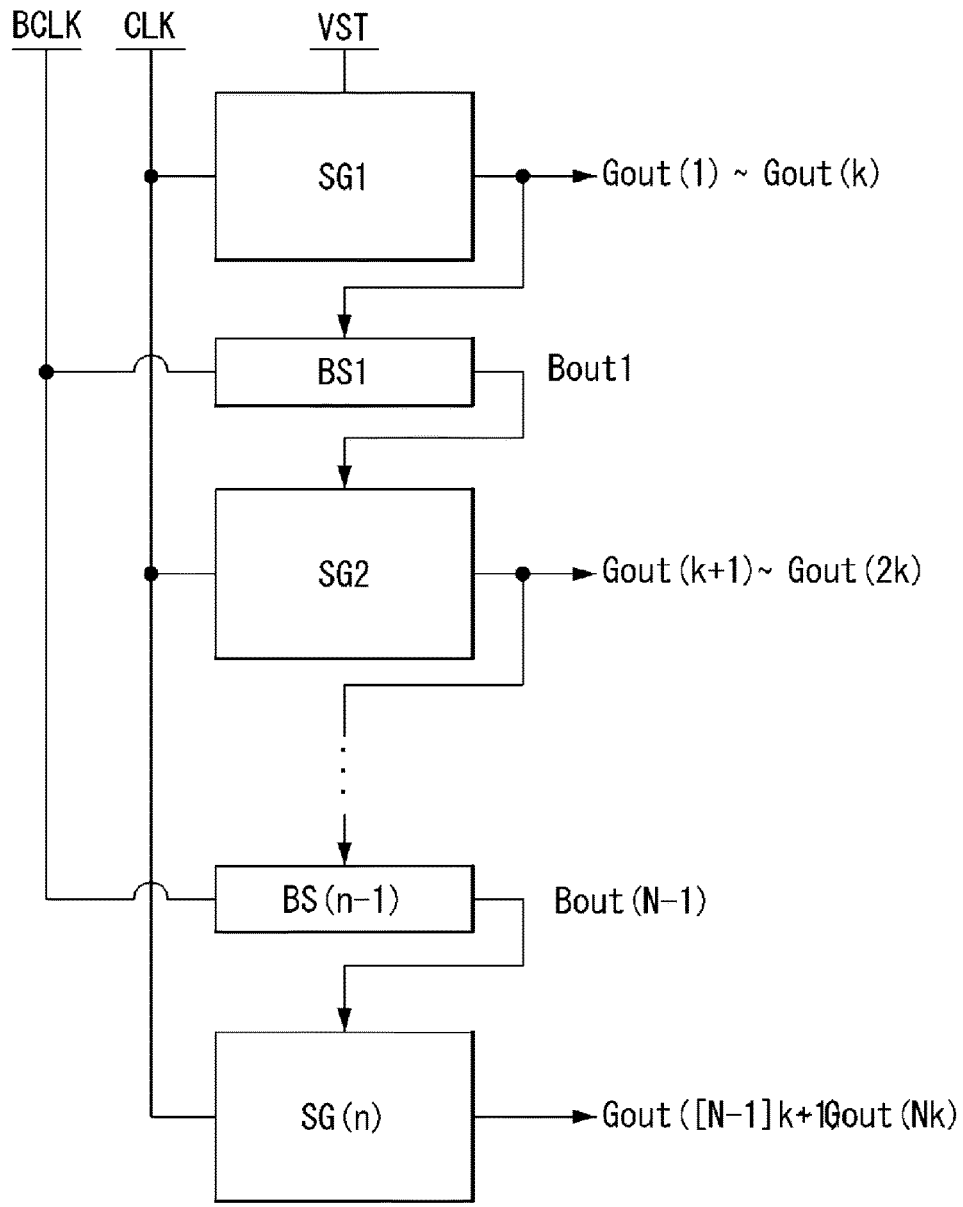
FIG. 6 illustrates a configuration of a shift register according to an example embodiment.
Figure 7:
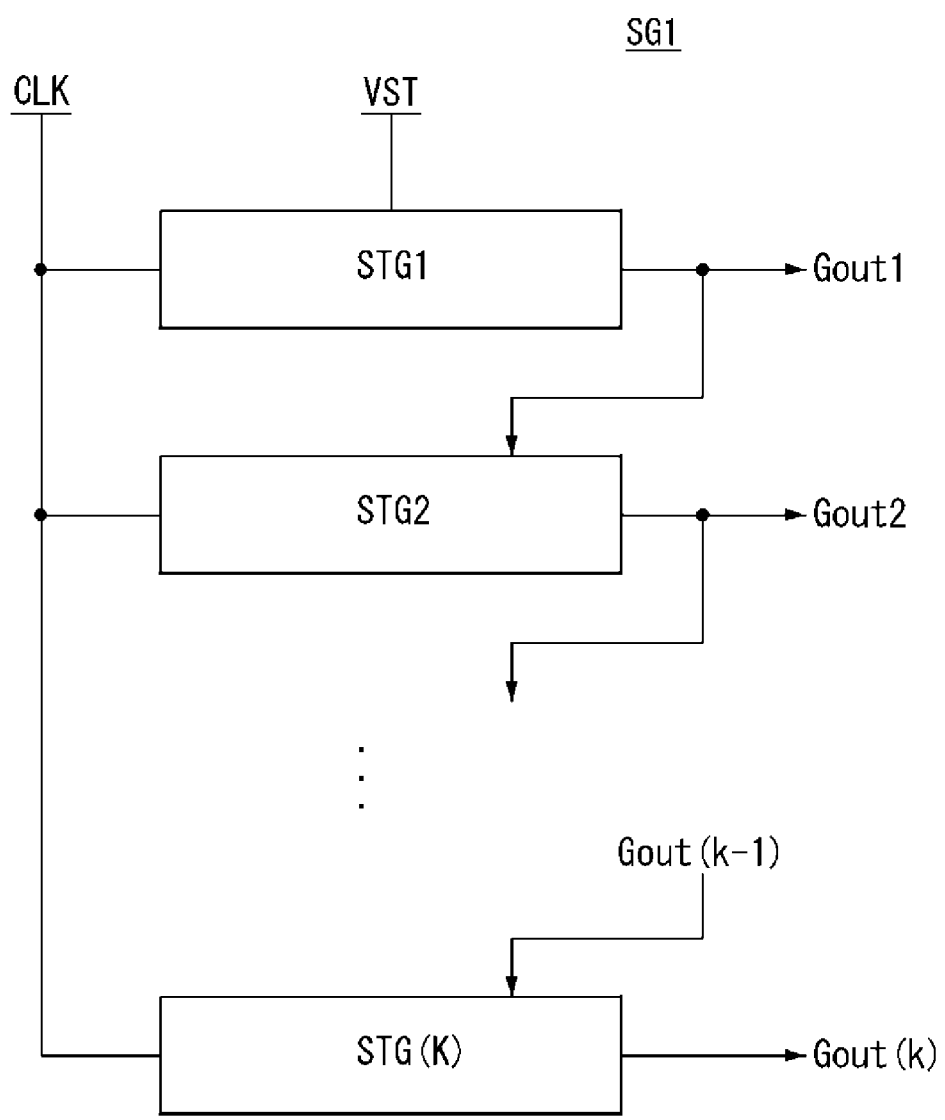
FIG. 7 illustrates stages of a shift register according to an example embodiment.

FIG. 6 illustrates a configuration of a shift register according to an example embodiment. FIG. 7 illustrates stages of a first shift register shown in FIG. 6. In the following description, a "preceding stage" is a stage positioned ahead of (before) a reference stage. For example, when an $i^{th}$ stage STG(i) is determined as a reference stage, where "i" is a natural number less than "N×k", and "k" is a natural number, the preceding stage is one of first to $(i-1)^{th}$ stages ST1 to STG(i-1). Further, a "subsequent stage" is a stage positioned behind (after) the reference stage.

With reference to FIGS. 6 and 7, a shift register according to an embodiment may include first to $n^{th}$ stage groups SG1 to SG(n) and first to $(N-1)^{th}$ bridge stages BS1 to BS(N-1). "N" and "n" are natural numbers.

A $j^{th}$ stage group SG(j) may apply a gate pulse to the gate lines belonging to a $j^{th}$ panel block PBj, where "j" is a natural number equal to or less than N. The first to $n^{th}$ stage groups SG1 to SG(n) may each include K stages for outputting (providing) K gate pulses. For example, the first stage group SG1 may include first to $K^{th}$ stages STG1 to STG(K). "K" and "k" may be equal. "N" and "n" may be equal.

In the first stage group SG1, output (provided) signals of the first to $K^{th}$ stages STG1 to STG(K) may be carry signals applied to a subsequent stage. For example, a first gate pulse Gout1 may be applied to the second stage STG2, and a $(k-1)^{th}$ gate pulse Gout(k-1) may be applied to the $K^{th}$ stage STG(K). Then, a $k^{th}$ gate pulse Gout(k) may be applied to a first bridge stage BS1.

The first to $(n-1)^{th}$ bridge stages BS1 to BS(n-1) may be positioned between the first to $N^{th}$ stage groups SG1 to SG(n), and may output (provide) an output Bout, e.g., Bout(1) to Bout(N-1), which may be a first carry signal Carry1. The first carry signal Carry1 may be applied to a first transistor T1 of a subsequent stage. For example, the first carry signal Carry1 output (provided) from the first bridge stage BS1 may be applied to a first stage STG(K+1) of the second stage group SG2.

Figure 8:
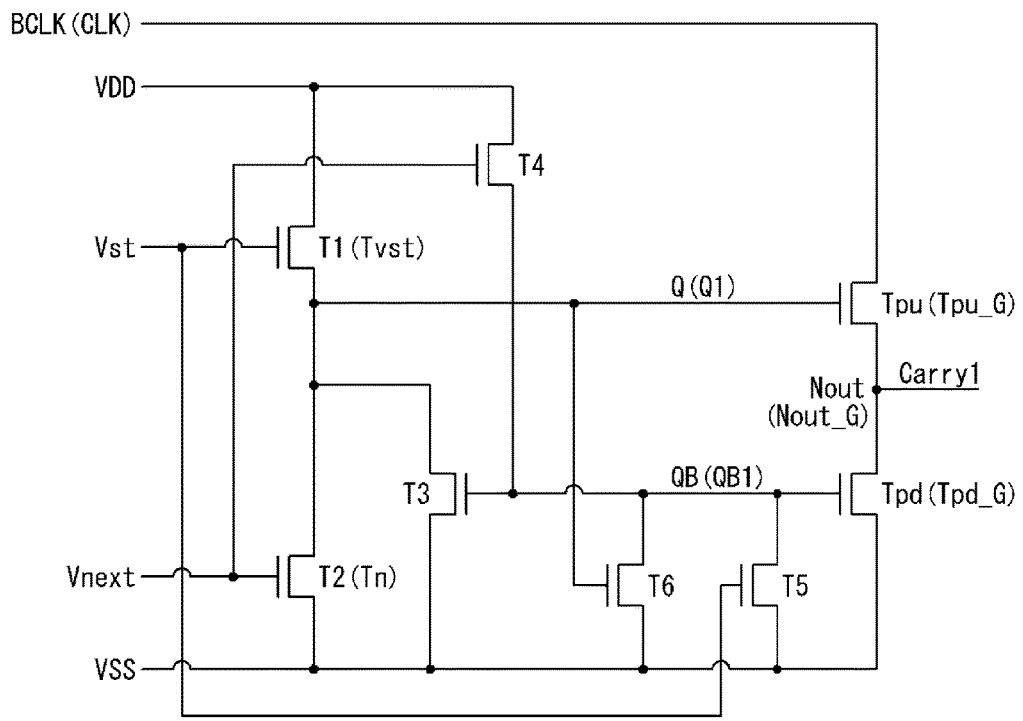
FIG. 8 illustrates a bridge stage according to a first example embodiment.

FIG. 8 illustrates a bridge stage according to a first example embodiment.

The stages of the first and second stage groups and the bridge stage according to the first example embodiment may be implemented with the same circuit. In embodiments disclosed herein, a configuration of the stages of the first and second stage groups are denoted by reference numerals denoted by parentheses, to distinguish it from configuration of the first stage. A first transistor of the first and second stage groups is referred to as a "start control transistor," and a second transistor of the first and second stage groups is referred to as a "Q node control transistor."

With reference to FIG. 8, a bridge stage BS may include a pull-up transistor Tpu, a pull-down transistor Tpd, and first to sixth transistors T1 to T6. The pull-up transistor Tpu may include a gate electrode connected to a Q node, a drain electrode receiving a bridge clock BCLK, and a source electrode connected to an output terminal Nout. As a result, the pull-up transistor Tpu may output (provide) a first carry signal Carry1 in response to a voltage of the Q node during an application of the bridge clock BCLK.

The pull-down transistor Tpd may include a gate electrode connected to a QB node, a drain electrode connected to the output terminal Nout, and a source electrode connected to an input terminal of a low potential voltage VSS. The pull-down transistor Tpd may discharge a voltage of the output terminal Nout to the low potential voltage VSS in response to a voltage of the QB node.

The first transistor T1 may include a gate electrode connected to a start signal input terminal Vst, a drain electrode connected to an input terminal of a high potential voltage VDD, and a source electrode connected to the Q node. The start signal input terminal Vst may receive a gate pulse Gout(i-1) of a preceding stage. For example, the start signal input terminal Vst of the first bridge stage BS1 may receive the $k^{th}$ gate pulse Gout(k). The first transistor T1 may charge the Q node in accordance with a voltage of the start signal input terminal Vst.

The second transistor T2 may include a gate electrode connected to a next signal input terminal Vnext, a drain electrode connected to the Q node, and a source electrode connected to the input terminal of the low potential voltage VSS. The next signal input terminal Vnext may receive a gate pulse of a subsequent stage. For example, a next signal input terminal Vnext of the first bridge stage BS1 may receive a $(k+1)^{th}$ gate pulse Gout(k+1). The second transistor T2 may discharge the Q node to the low potential VSS in response to a voltage of the next signal input terminal Vnext.

The third transistor T3 may include a gate electrode connected to the QB node, a drain electrode connected to the Q node, and a source electrode connected to the input terminal of the low potential voltage VSS. The third transistor T3 may discharge the voltage of the Q node to the low potential voltage VSS when the QB node is charged.

The fourth transistor T4 may include a gate electrode connected to the next signal input terminal Vnext, a drain electrode connected to the input terminal of the high potential voltage VDD, and a source electrode connected to the QB node. The fourth transistor T4 may charge the QB node to the high potential voltage VDD in response to the voltage of the next signal input terminal Vnext.

The fifth transistor T5 may include a gate electrode connected to the start signal input terminal Vst, a drain electrode connected to the QB node, and a source electrode connected to the input terminal of the low potential voltage VSS. The fifth transistor T5 may discharge the QB node to the low potential voltage VSS in response to the voltage of the start signal input terminal Vst.

The sixth transistor T6 may include a gate electrode connected to the Q node, a drain electrode connected to the QB node, and a source electrode connected to the input terminal of the low potential voltage VSS. The sixth transistor T6 may discharge the QB node to the low potential voltage VSS in response to the voltage of the QB node.

Figure 9:
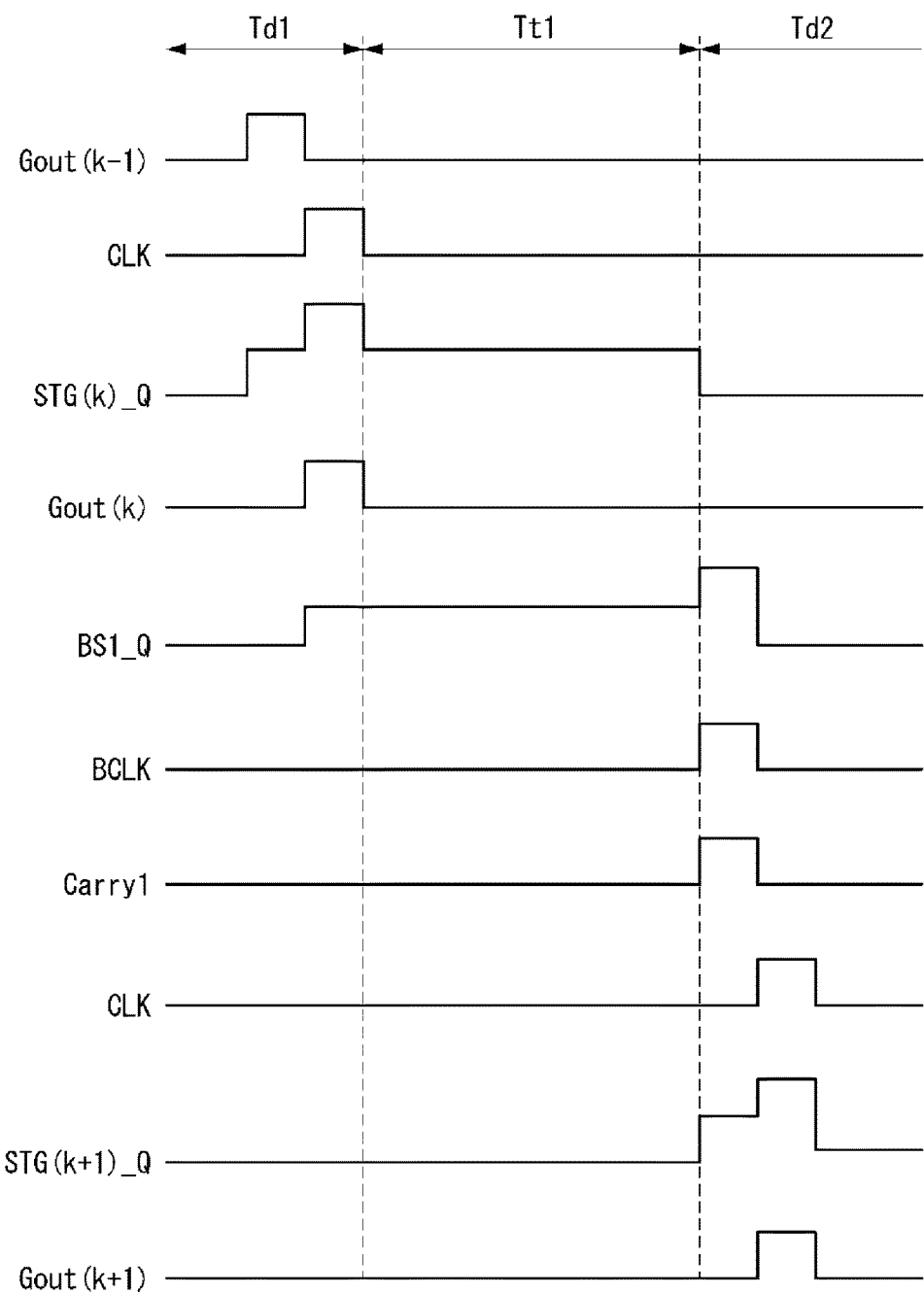
FIG. 9 is a timing diagram illustrating output signals of the stage shown in FIG. 8.

FIG. 9 is a timing diagram illustrating output signals of stages shown in FIG. 8.

FIG. 9 illustrates changes in voltages of driving signals and a main node of a bridge stage. An operation of a bridge stage is described below with reference to FIG. 9.

Before a first display period Td1 ends, a $K^{th}$ stage STG(K) may output (provide) a $k^{th}$ gate pulse Gout(k). The $k^{th}$ gate pulse Gout(k) may be applied to a gate electrode of a first transistor T1 included in a first bridge stage BS1.

The first transistor T1 of the first bridge stage BS1 may pre-charge the Q node to the high potential voltage VDD in response to the $k^{th}$ gate pulse Gout(k). During a first touch sensing period Tt1, the Q node may maintain a pre-charged state.

When a second display period Td2 starts after the first touch sensing period Tt1 ends, a drain electrode of a pull-up transistor Tpu of the first bridge stage BS1 may receive a bridge clock BCLK. The Q node, which may be a gate electrode of the pull-up transistor Tpu, may be bootstrapped due to the bridge clock BCLK. When a gate-to-source voltage of the pull-up transistor Tpu reaches a threshold voltage Vth in a process for bootstrapping the Q node, the pull-up transistor Tpu may be turned on. The bridge clock BCLK may be applied before a $(k+1)^{th}$ gate pulse Gout(k+1) is output (provided) in the second display period Td2. The pull-up transistor Tpu of the first bridge stage BS1 may output (provide) a first carry signal Carry1 through the output terminal Nout (see FIG. 8).

The first carry signal Carry1 may be applied to a start control transistor Tvst (e.g., T1 of FIG. 8) of a $(k+1)^{th}$ stage STG(K+1). The start control transistor Tvst of the $(k+1)^{th}$ stage STG(k+1) may pre-charge a Q1 node (e.g., Q node on FIG. 8) in response to the first carry signal Carry1. The $(k+1)^{th}$ stage STG(K+1), in which the Q1 node may be pre-charged, may charge an output terminal Nout_G (e.g., Nout of FIG. 8) using a gate clock CLK applied to a pull-up transistor Tpu_G (e.g., Tpu in FIG. 8), and may output (provide) the $(k+1)^{th}$ gate pulse Gout(k+1).

As described above, the shift register according to an embodiment may include a bridge stage for charging a Q node of a stage, which may output (provide) a first gate pulse after the touch sensing period Tt ends. As a result, an embodiment can solve a problem in that the gate pulse Gout may not be output smoothly because a Q node of a first stage of the panel block may be discharged during the touch sensing period Tt.

Figure 10:
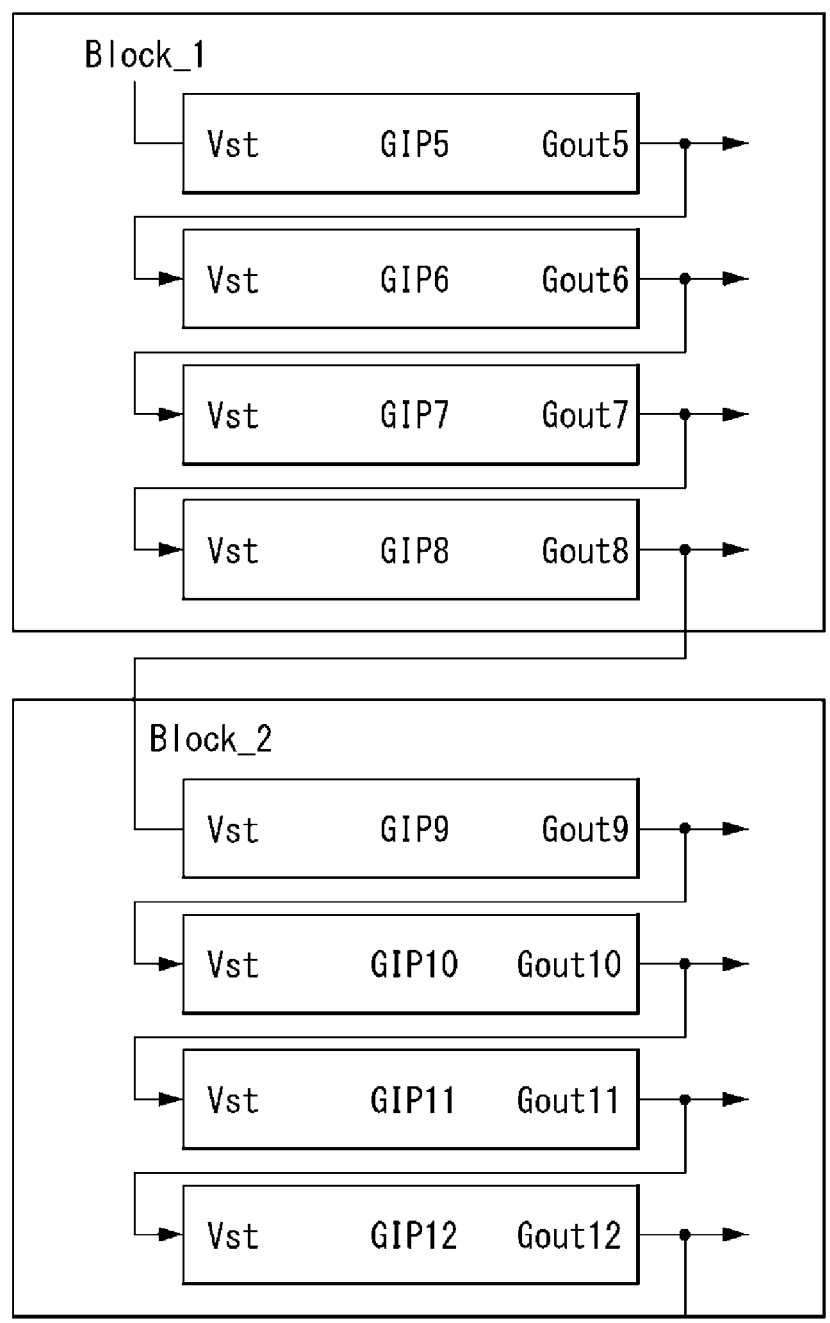
FIG. 10 illustrates a shift register according to a comparative example.
Figure 11:
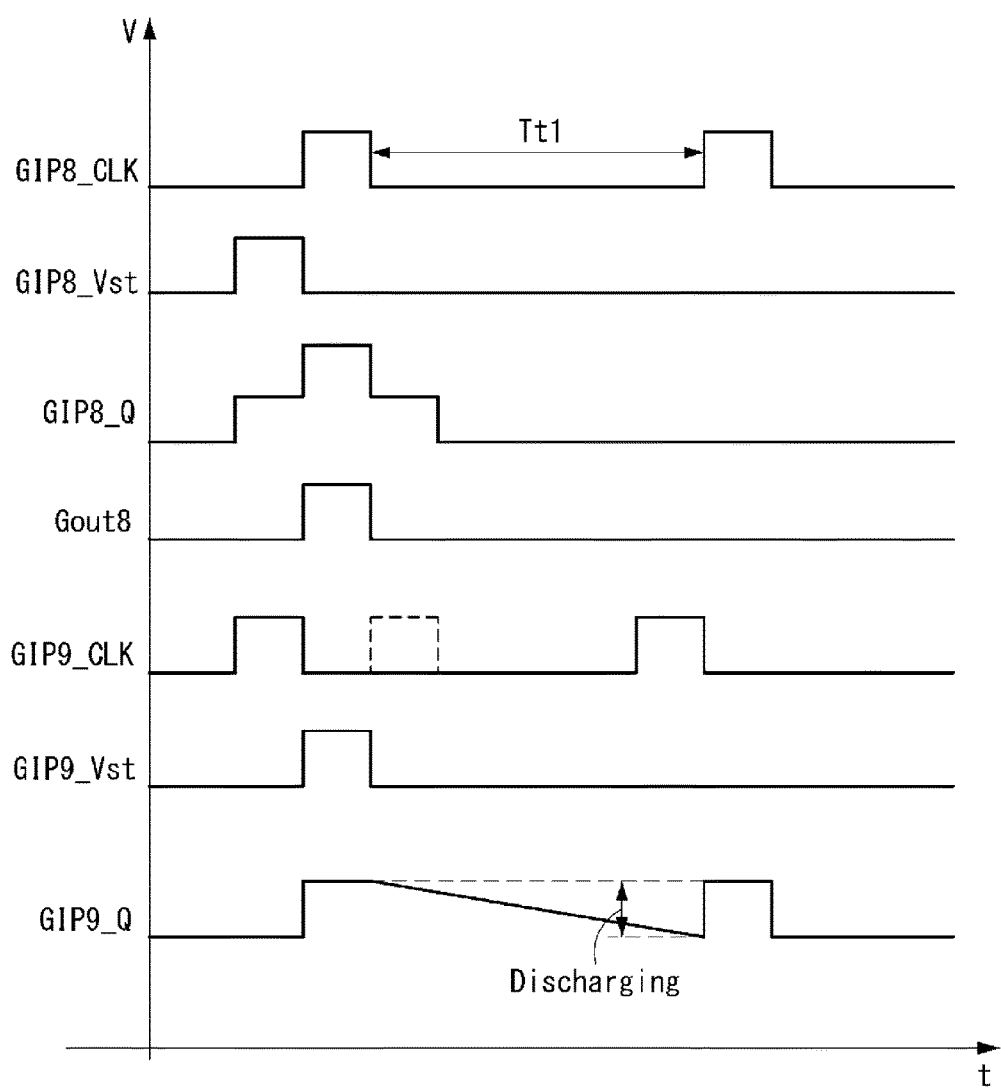
FIG. 11 is a timing diagram illustrating output signals of the shift register shown in FIG. 10.

FIG. 10 illustrates a configuration of a shift register according to a comparative example. FIG. 11 is a timing diagram illustrating output signals of the shift register shown in FIG. 10.

Each stage GIP shown in the FIG. 10 example may be implemented with a similar circuit to those illustrated in the example stages of the stage group according to the first embodiment.

With reference to FIGS. 10 and 11, stages according to a comparative example may receive an output of a preceding stage as a start signal Vst, and may output (provide) a gate pulse. A first touch sensing period Tt1 may exist between a first period in which a first stage group Block_1 may be driven and a second period in which a second stage group Block_2 may be driven.

In the comparative example, a ninth stage GIP9 (e.g., in the second stage group Block_2) receives an output of an eighth stage GIP8 (e.g., in the first stage group Block_1) as a start signal GIP_Vst, and charges a Q node GIP9_Q. The ninth stage GIP9 outputs a ninth gate pulse Gout9 when a gate clock GIP9_CLK is input. The ninth stage GIP9 receives a gate clock GIP9_CLK at a time point when a first touch sensing period Tt1 has elapsed since the Q node GIP9_Q was charged. As a result, the Q node GIP9_Q of the ninth stage GIP9 is discharged during the first touch sensing period Tt1, and the bootstrapping is not performed smoothly even if the gate clock GIP9_CLK is input. In addition, the ninth stage GIP9 cannot output the ninth gate pulse Gout9 in the comparative example.

On the other hand, in the display device according to the first embodiment, a first stage (e.g., STG(K+1)) of the panel block may operate using a first carry signal output (provided) by a first bridge stage BS1 after the touch sensing period Tt ends. Thus, embodiments can improve a phenomenon in which the gate pulse is not output smoothly because the Q node of the first stage of the panel block is discharged during the touch sensing period Tt.

Figure 12:
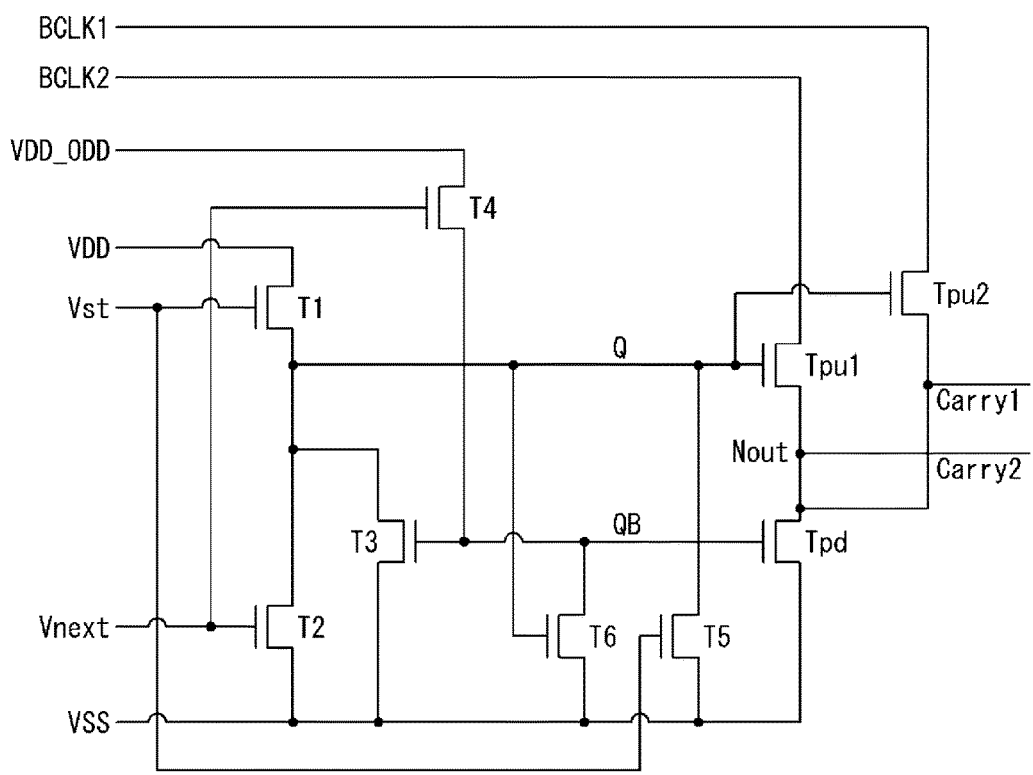
FIG. 12 illustrates a bridge stage according to a second example embodiment.
Figure 13:
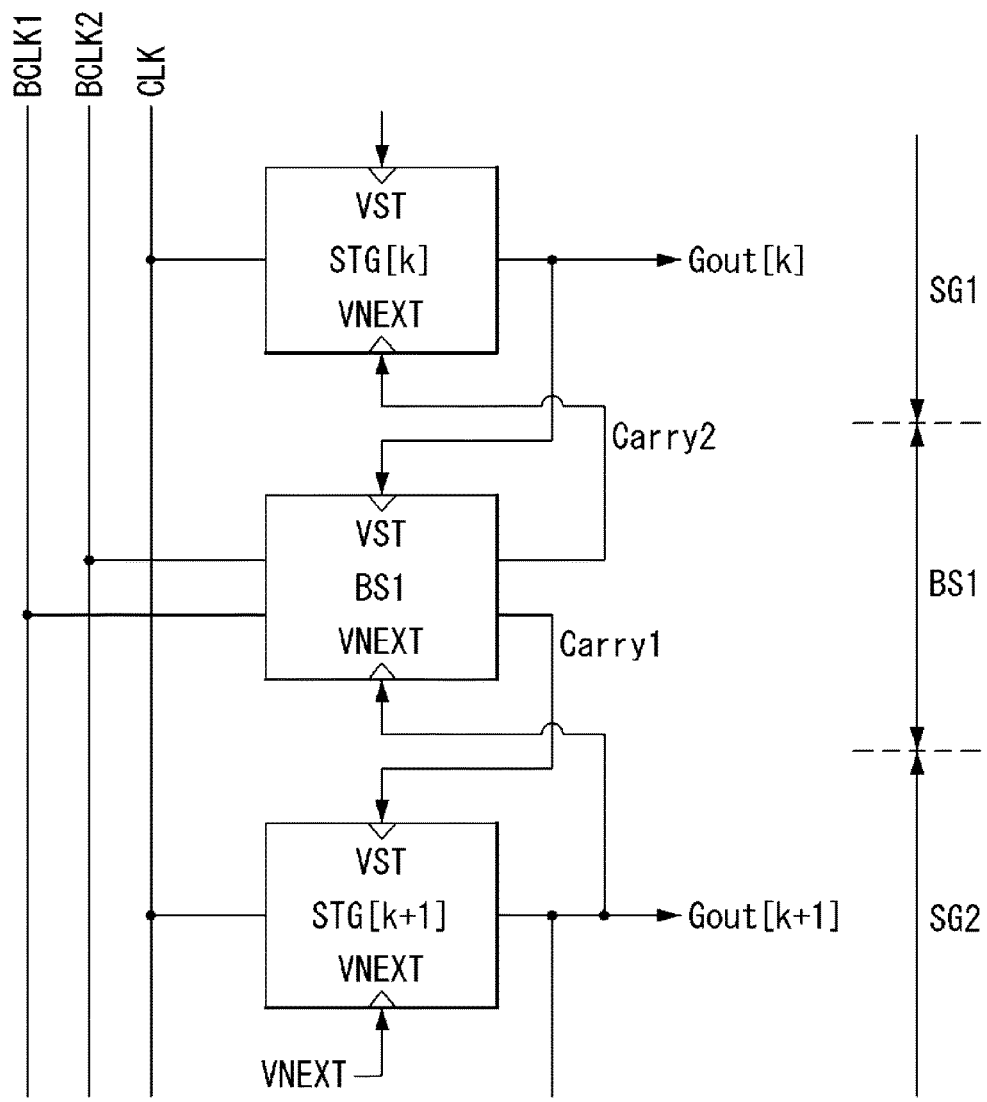
FIG. 13 illustrates a shift register to which a bridge stage shown in FIG. 12 is applied.
Figure 14:
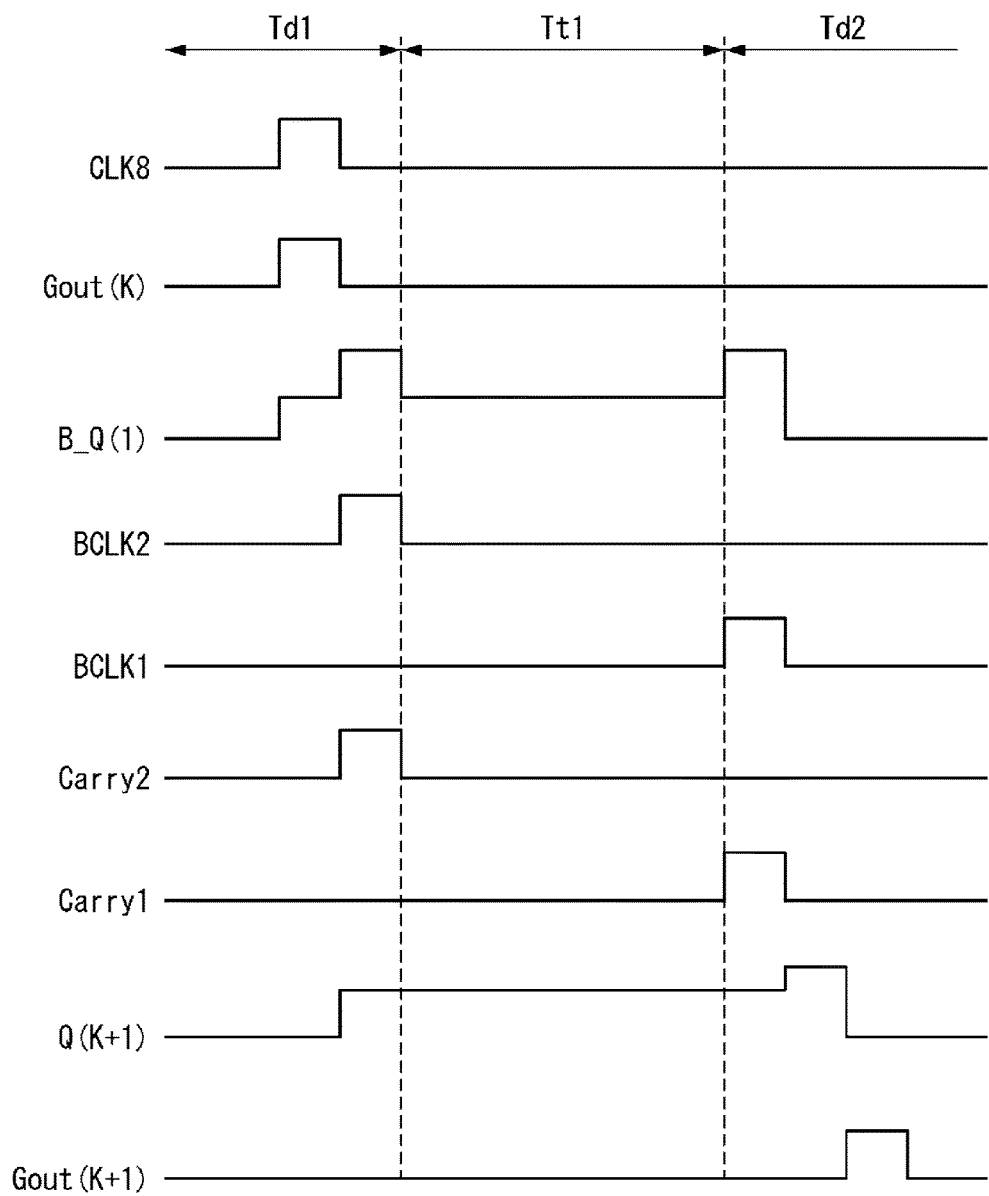
FIG. 14 is a timing diagram illustrating output signals of the stage shown in FIG. 12.

FIG. 12 illustrates a bridge stage according to a second example embodiment. FIG. 13 illustrates a shift register to which a bridge stage shown in FIG. 12 is applied. FIG. 14 is a timing diagram illustrating output signals of stages shown in FIG. 12.

In addition, FIG. 13 illustrates a preceding stage and a subsequent stage of a bridge stage. FIG. 14 is a timing diagram illustrating driving signals and a voltage of a main node of the bridge stage according to the second example embodiment. The shift register according to the second embodiment has substantially the same configuration as the shift register according to the first embodiment, and may output (provide) gate pulses through the same operation as the first embodiment. Thus, a detailed description of the configuration and the operation of the shift register according to the second embodiment will be omitted below.

The stage shown in FIG. 12 is an example of a bridge stage. For example, a circuit configuration of stages for applying a gate pulse to a panel block is described based on the stage shown in FIG. 8. The bridge stage according to the second embodiment and an operation thereof are described with reference to FIGS. 12 to 14. The bridge stage BS according to the second embodiment may include first and second pull-up transistors Tpu1 and Tpu2, a pull-down transistor Tpd, and first to sixth transistors T1 to T6.

The second pull-up transistor Tpu2 may include a gate electrode connected to a Q node, a drain electrode receiving a first bridge clock BCLK1, and a source electrode connected to a first output terminal, which may output (provide) a first carry signal Carry1. As a result, the second pull-up transistor Tpu2 may output (provide) a first carry signal Carry1 in response to a voltage of the Q node during an application of the first bridge clock BCLK1.

The first pull-up transistor Tpu1 includes a gate electrode connected to the Q node, a drain electrode receiving a second bridge clock BCLK2, and a source electrode connected to a second output terminal Nout, which may output (provide) a second carry signal Carry2. As a result, the first pull-up transistor Tpu1 may output (provide) a second carry signal Carry2 in response to the voltage of the Q node during an application of the second bridge clock BCLK2.

Before a first display period Td1 ends, a $K^{th}$ stage STG[K] may output (provide) a $k^{th}$ gate pulse Gout[k]. The $k^{th}$ gate pulse Gout[k] may be applied to a gate electrode of a first transistor T1 included in a first bridge stage BS1. The first transistor T1 of the first bridge stage BS1 may pre-charge the Q node to a high potential voltage VDD in response to the $k^{th}$ gate pulse Gout[k].

After the $k^{th}$ gate pulse Gout[k] ends in the first display period Td1, a drain electrode of the first pull-up transistor Tpu1 may receive the bridge clock BCLK2. The Q node, which may be a gate electrode of the first pull-up transistor Tpu1, may be bootstrapped due to the second bridge clock BCLK2. When a gate-to-source voltage of the first pull-up transistor Tpu1 reaches a threshold voltage Vth in a process for bootstrapping the Q node, the first pull-up transistor Tpu1 may be turned on. As a result, the first pull-up transistor Tpu1 of the first bridge stage BS1 may output (provide) the second carry signal Carry2 through the second output terminal Nout.

The second carry signal Carry2 may be applied to a Q node control transistor Tn included in a preceding stage, for example, the $K^{th}$ stage STG[K]. The Q node control transistor Tn of the $K^{th}$ stage STG[K] may discharge the Q node in response to the second carry signal Carry2. As a result, a pull-down transistor Tpd_G of a last stage (for example, the $K^{th}$ stage STG[K]) of the panel block may maintain a turn-off state.

In the above-described first embodiment, because the pull-up transistor Tpu disposed at the last stage of the panel block PB may receive the high potential voltage during the touch sensing period Tt1, the deterioration may be accelerated.

On the other hand, the bridge stage BS according to the second embodiment may discharge a Q node of a preceding stage using the second carry signal Carry2 output (provided) before the touch sensing period Tt. As a result, in the second embodiment, because the first pull-up transistor Tpu1 disposed at the last stage of the panel block BP may receive the low potential voltage during the touch sensing period Tt, the acceleration of the deterioration can be prevented or reduced.

The first bridge clock BCLK1 may be applied before a $(k+1)^{th}$ gate pulse Gout[k+1] is output in the second display period Td2. The first pull-up transistor Tpu1 of the first bridge stage BS1 may output (provide) the first carry signal Carry1 through the first output terminal Nout.

The first carry signal Carry1 may be applied to a first transistor T1 of a subsequent stage, for example, a $(K+1)^{th}$ stage STG[K+1]. The first transistor T1 of the $(K+1)^{th}$ stage STG[K+1] pre-charges the Q node in response to the first carry signal Carry1. The $(K+1)^{th}$ stage STG[K+1], in which the Q node may be pre-charged, may charge the first output terminal Nout using the gate clock CLK applied to the pull-up transistor Tpu, and may output (provide) the $(k+1)^{th}$ gate pulse Gout[k+1].

It will be apparent to those skilled in the art that various modifications and variations may be made in the present disclosure without departing from the technical idea or scope of the disclosure. Thus, it is intended that embodiments of the present disclosure cover the modifications and variations of the disclosure provided they come within the scope of the appended claims and their equivalents.

What is claimed is:

1. A touch sensor integrated type display device, comprising:
    a display panel including first and second panel blocks, each of the first and second panel blocks including a pixel array in which touch sensors are embedded;
    a display driving circuit configured to provide image data to pixels of each of the first and second panel blocks during a display period; and
    a touch sensing circuit configured to drive the touch sensors of each of the first and second panel blocks during a touch sensing period,
    wherein the display driving circuit includes a shift register configured to sequentially provide gate pulses to gate lines,
    wherein the shift register includes:
        a first stage group configured to apply a gate pulse to gate lines in the first panel block,
        a bridge stage connected in cascade to a last stage of the first stage group, the bridge stage being configured to provide a first carry signal in synchronization with a first bridge clock, and
        a second stage group configured to apply a gate pulse to gate lines in the second panel block,
    wherein a first stage of the second stage group is configured to operate in response to the first carry signal,
    wherein the bridge stage is further configured to:
        generate the first carry signal,
        provide the first carry signal only to the first stage of the second stage group,
        generate a second carry signal,
        provide the second carry signal only to the last stage of the first stage group, and
    wherein the first bridge clock is configured to be applied before the first stage of the second stage group, and provide the gate pulse in the display period in which an image is displayed on the pixels of the second panel block.

2. The touch sensor integrated type display device of claim 1, wherein the bridge stage includes:
    a first transistor including:
        a gate electrode connected to a start signal input terminal;
        a drain electrode connected to a high potential voltage input terminal; and
        a source electrode connected to a Q node; and
    a first pull-up transistor configured to provide the first carry signal using the first bridge clock applied to a drain electrode in response to a voltage of the Q node.

3. The touch sensor integrated type display device of claim 2, wherein the start signal input terminal of the bridge stage is configured to receive the gate pulse that is provided by the last stage of the first stage group.

4. The touch sensor integrated type display device of claim 2, wherein:
    each stage included in each of the first and second stage groups includes:
        a start control transistor configured to charge a Q1 node to a high potential voltage in response to a voltage of the start signal input terminal; and
        a pull-up transistor configured to provide the gate pulse using a gate clock applied to a drain electrode in response to a voltage of the Q1 node; and
    the first carry signal is configured to be applied to a gate electrode of the start control transistor included in the first stage of the second stage group.

5. The touch sensor integrated type display device of claim 4, wherein:
    the bridge stage further includes a second pull-up transistor configured to provide the second carry signal using a second bridge clock applied to a drain electrode in response to the voltage of the Q node; and
    the second bridge clock is configured to be applied after the last stage of the first stage group provides the gate pulse in the display period in which an image is displayed on the pixels of the first panel block.

6. The touch sensor integrated type display device of claim 5, wherein:
    each of the stages included in each of the first and second stage groups further includes a Q node control transistor configured to discharge the Q1 node to a low potential voltage in response to a voltage of a next signal input terminal; and
    the second carry signal is applied to a gate electrode of the Q node control transistor included in the last stage of the first stage group.

7. A method of operating a touch sensor integrated type display device including a display panel including first and second panel blocks, each of the first and second panel blocks including a pixel array in which touch sensors are embedded, the method comprising:
    during a touch sensing period, by a touch sensing circuit, driving the touch sensors of each of the first and second panel blocks,
    during a display period:
        by a display driving circuit, providing image data to pixels of each of the first and second panel blocks; and
        by a shift register included in the display driving circuit, sequentially providing gate pulses to gate lines,
        by a first stage group included in the shift register, applying a gate pulse to gate lines in the first panel block;
        by a bridge stage, providing a first carry signal in synchronization with a first bridge clock, the bridge stage being included in the shift register, the bridge stage being connected in cascade to a last stage of the first stage group; and
        by a second stage group included in the shift register, applying a gate pulse to gate lines in the second panel block, wherein a first stage of the second stage group operates in response to the first carry signal, wherein the first carry signal is generated by the bridge stage and is provided only to the first stage of the second stage group, wherein a second carry signal is generated by the bridge stage and is provided only to the last stage of the first stage group, and wherein applying the first bridge clock before the first stage of the second stage group provides the gate pulse in the display period in which an image is displayed on the pixels of the second panel block.

8. The method of claim 7, wherein:

the bridge stage further includes a first transistor including:
- a gate electrode connected to a start signal input terminal;
- a drain electrode connected to a high potential voltage input terminal; and
- a source electrode connected to a Q node; and the method further comprises providing, by a first pull-up transistor, the first carry signal using the first bridge clock applied to a drain electrode in response to a voltage of the Q node.

9. The method of claim 8, wherein the start signal input terminal of the bridge stage receives the gate pulse that is provided by the last stage of the first stage group.

10. The method of claim 8, wherein in each stage included in each of the first and second stage groups:

a start control transistor charges a Q1 node to a high potential voltage in response to a voltage of the start signal input terminal; and a pull-up transistor provides the gate pulse using a gate clock applied to a drain electrode in response to a voltage of the Q1 node, wherein the first carry signal is applied to a gate electrode of the start control transistor included in the first stage of the second stage group.

11. The method of claim 10, wherein:

in the bridge stage, a second pull-up transistor provides the second carry signal using a second bridge clock applied to a drain electrode in response to the voltage of the Q node; and the second bridge clock is applied after the last stage of the first stage group provides the gate pulse in the display period in which an image is displayed on the pixels of the first panel block.

12. The method of claim 11, wherein:

in each of the stages included in each of the first and second stage groups, a Q node control transistor discharges the Q1 node to a low potential voltage in response to a voltage of a next signal input terminal; and the second carry signal is applied to a gate electrode of the Q node control transistor included in the last stage of the first stage group.

* * * * *